United States Patent [19]
McClure

[11] Patent Number: 5,805,611
[45] Date of Patent: Sep. 8, 1998

[54] METHOD AND APPARATUS FOR TESTING HIGH-FREQUENCY INTEGRATED CIRCUITS USING A LOWER-FREQUENCY TESTER

[75] Inventor: David C. McClure, Carrollton, Tex.

[73] Assignee: STMicroelectronics, Inc., Carrollton, Tex.

[21] Appl. No.: 773,068

[22] Filed: Dec. 26, 1996

[51] Int. Cl.⁶ .................................................. G06F 11/00
[52] U.S. Cl. .......................................... 371/27.7; 327/116
[58] Field of Search .............................. 371/27.7, 22.36, 371/22.31, 22.5, 27.5, 22.1, 21.1, 42; 395/183.06, 183.18, 183.12; 324/765, 73.1; 365/201; 326/93; 327/116, 119, 120

[56] References Cited

U.S. PATENT DOCUMENTS

| | | | |
|---|---|---|---|
| 5,336,939 | 8/1994 | Eitrheim et al. | 307/269 |
| 5,381,087 | 1/1995 | Hirano | 324/158.1 |
| 5,422,858 | 6/1995 | Mizukami et al. | 365/233 |
| 5,453,993 | 9/1995 | Kitaguchi et al. | 371/22.5 |
| 5,473,618 | 12/1995 | Takeshita et al. | 371/22.5 |
| 5,499,250 | 3/1996 | Ingalls et al. | 371/28 |
| 5,524,114 | 6/1996 | Peng | 371/22.1 |
| 5,570,381 | 10/1996 | Schofield | 371/61 |
| 5,614,838 | 3/1997 | Jaber et al. | 324/765 |
| 5,640,509 | 6/1997 | Balmer et al. | 395/183.18 |

*Primary Examiner*—Robert W. Beausoliel, Jr.
*Assistant Examiner*—Nadeem Iqbal
*Attorney, Agent, or Firm*—Theodore E. Glanathay; Lisa K. Jorgenson

[57] ABSTRACT

The present invention is directed to a method and apparatus for testing integrated circuits using a tester with a frequency limitation lower than what is needed to fully test the integrated circuit. Clock signals, each lower than that needed to test an integrated circuit at speed, are generated by a tester. These clock signals are connected to separate output pins of the integrated circuit. At least two of the input signals are out of phase with each other. The input clock signals are combined to create a test clock signal with a higher frequency, thus allowing the integrated circuit to be tested at its normal, operating frequency. A toggle signal may be provided to an additional pin on the integrated circuit. Use of the toggle signal allows test data to be written at the maximum frequency of the integrated circuit. The present invention does not create any significant delay during normal operation of the integrated circuit, and also does not create any significant layout penalty.

15 Claims, 4 Drawing Sheets

METHOD AND APPARATUS FOR TESTING HIGH-FREQUENCY INTEGRATED CIRCUITS USING A LOWER-FREQUENCY TESTER

FIELD OF THE INVENTION

The present invention relates generally to integrated circuit devices, and more specifically to a method and circuit for testing integrated circuits.

BACKGROUND OF THE INVENTION

The design and manufacture of integrated circuits which are free of design and reliability problems is a challenging task. It is standard practice to test integrated circuits for "hard" functional failures, as well as for propensities to reliability problems. Such device testing is critical for identifying, analyzing, and correcting problem areas early.

In modern, high density memories, such as random access memories having $2^{20}$ bits (1 Megabit) or more, the time and equipment required to test functionality and timing of all bits in the memory constitutes a significant portion of the manufacturing cost. Random access memories (RAMs) are especially subject to having significant test costs, both because of the necessity of writing data to and reading data from each of the bits in the memory, and also because RAMs are often subject to failures due to pattern sensitivity. Pattern sensitivity failures arise because the ability of a bit to retain its stored data state may depend upon the data states stored in, and the operations upon, bits which are physically adjacent to a particular bit being tested. Thus the time involved in testing each RAM device is a significant part of the manufacturing cost.

During testing, it is important that the reading and writing of data be done at the speed at which the RAM will ultimately attain in functional mode. However, many testers currently in use in the integrated circuit industry have frequency limitations which are below the requirements of the devices which need to be tested. For example, the Teradyne 997/994 testers have a frequency limitation of approximately 100 Megahertz (MHz). These particular testers are often used to test Burst Static Random Access Memory devices, referred to as Burst RAMs. A Burst RAM designed for use with the Pentium Pro microprocessor (Pentium Pro is a trademark of Intel Corporation) needs to cycle at speeds in excess of 100 MHz. Currently, the Pentium Pro Burst RAM cycles at approximately 120 MHZ, and it is anticipated that its speed will increase to 200 MHz or more in the near future.

One alternative to solving the problem of how to test integrated circuits at faster cycle times is to purchase or develop new testers that cycle at the faster times required. However, this is an expensive approach. Most integrated circuit manufacturers are reluctant to invest large amounts of money in new test equipment. Also, it is probable that at some time in the future, even a higher speed tester would not meet the frequency demands of new integrated circuits.

Consequently, there is a need for a method of testing an integrated circuit using a tester with a frequency limitation lower than the cycle time of the integrated circuit.

SUMMARY OF THE INVENTION

Accordingly, the present invention is directed to a method and apparatus for testing integrated circuits using a tester with a frequency limitation lower than what is needed to fully test the integrated circuit.

Clock signals, each lower than that needed to test an integrated circuit at speed, are generated by a tester. These clock signals are connected to separate input pins of the integrated circuit. At least two of the input clock signals are out of phase with each other. The input clock signals are combined to create a test clock signal with a higher frequency, thus allowing the integrated circuit to be tested at its normal, operating frequency.

In addition to providing a separate clock signal input pin, to more than one, a toggle signal may be provided to an additional pin on the integrated circuit. By changing the state of the toggle signal, test data is either sent through a pass gate or an inverter. Use of the toggle signal allows test data to be written at the maximum frequency of the integrated circuit. The test data written may be all "0"s, all "1"s, or an alternating pattern of "0"s and (i.e. 1010 or 0101), exercising data setup and hold time in the same test cycle if desired.

One advantage of the present invention is that it does not create any significant delay during normal operation of the integrated circuit. A further advantage of the present invention is that there is minimal layout area penalty. Other advantages of the invention and a more complete understanding of the invention may be had by referring to the following description taken in conjunction with the accompanying drawings.

BRIEF DESCRIPTION OF THE DRAWINGS

FIG. 1, including

DETAILED DESCRIPTION OF A PREFERRED EMBODIMENT OF THE INVENTION

A Burst RAM and method for testing such a Burst RAM are used to illustrate the unique circuit and method of testing of the present invention. However, the present invention may be implemented in any integrated circuit, and may be used to test any integrated circuit, including, but not limited to, ROMs, FIFOs, DRAMs, EPROMs, EEPROMs, microprocessors, and other devices.

Figure 1A:
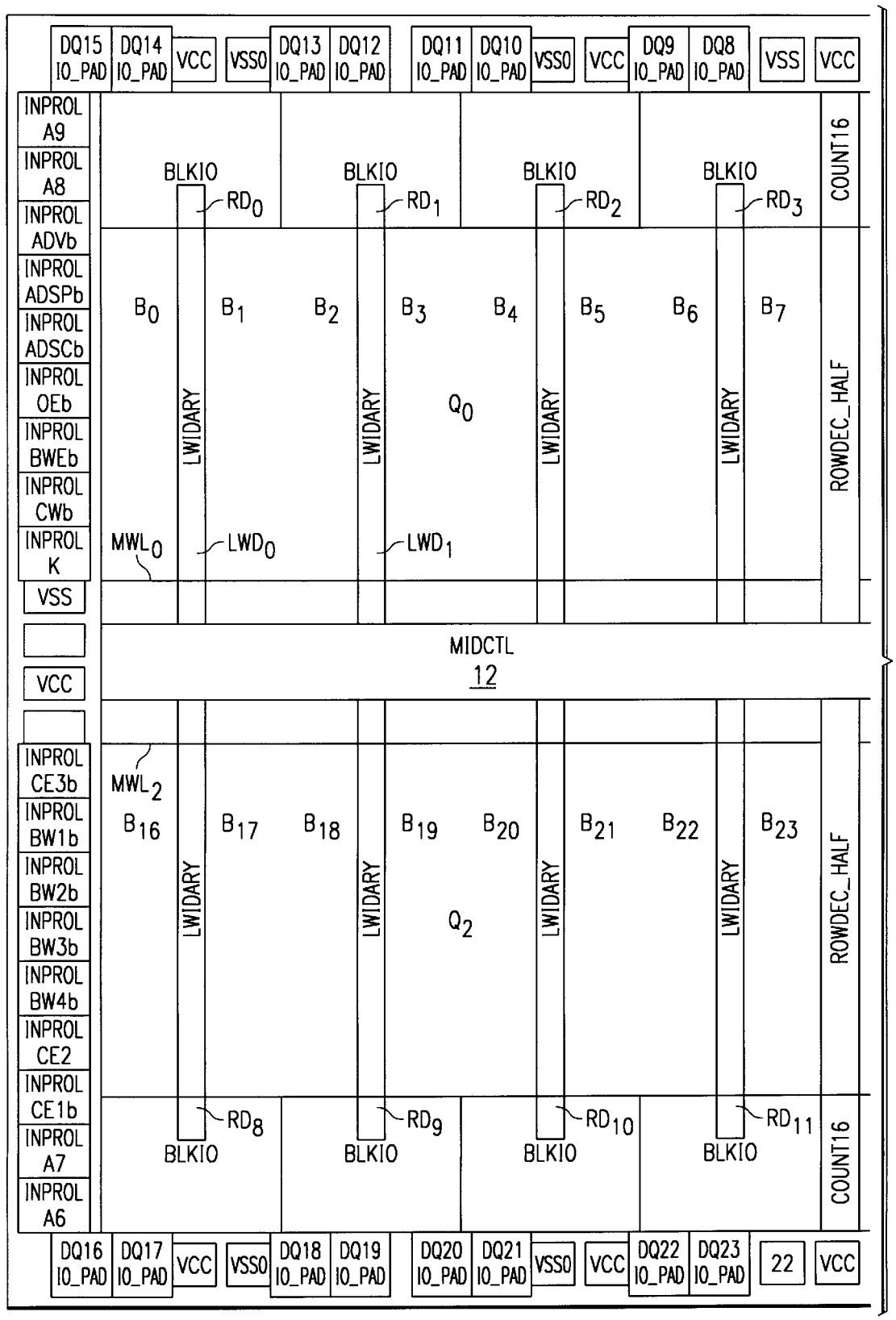
FIGS. 1a and 1b, is an electrical diagram, in block form, of an integrated circuit memory device.
Figure 1B:
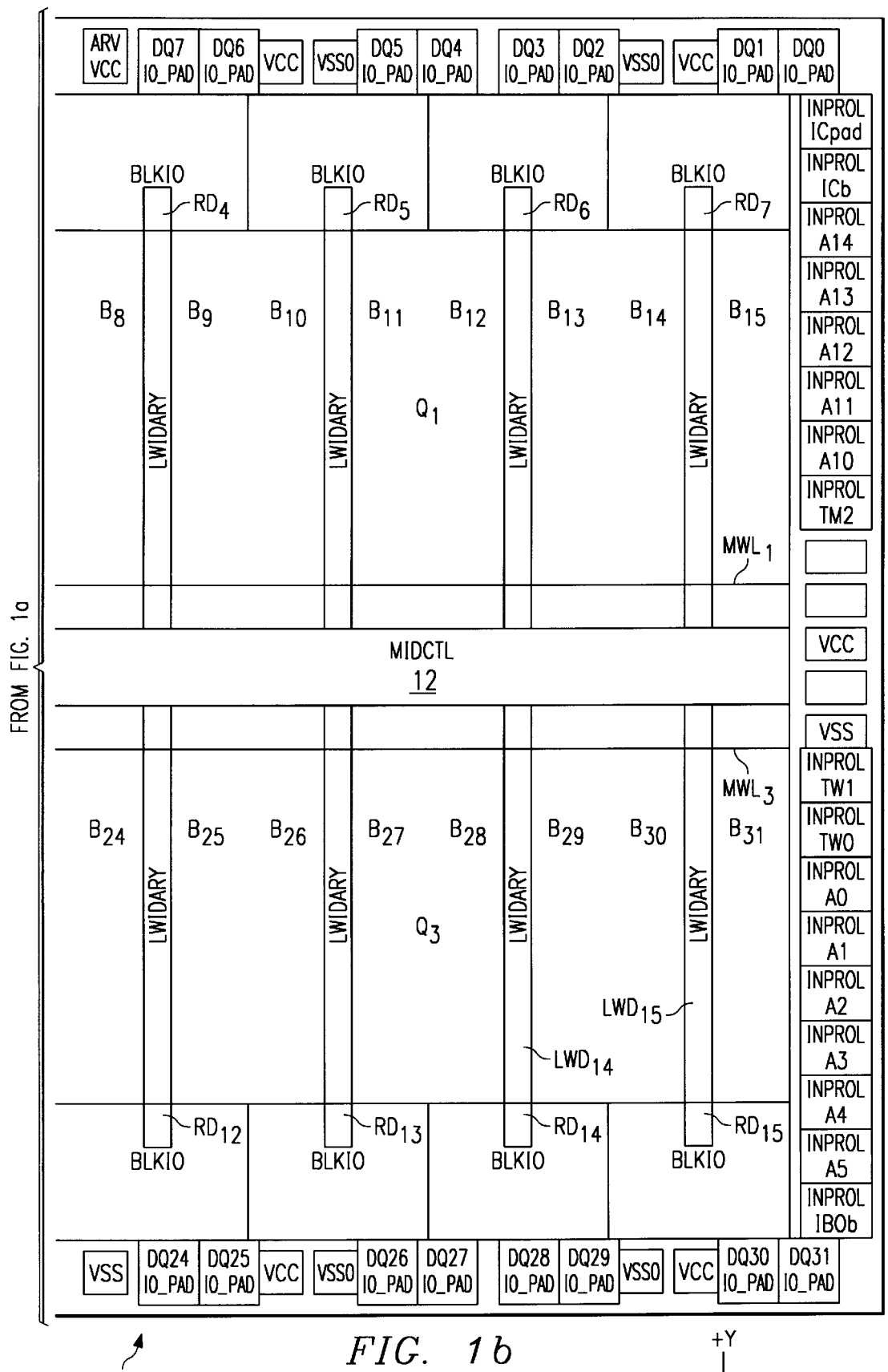

Referring to FIG. 1, a memory device 10 into which the preferred embodiment of the invention can be incorporated is shown. In this example, memory device 10 is a 32K×32 Burst Static Random Access Memory (Burst RAM). The memory device can have its memory cells in a single block or in multi blocks. In the preferred embodiment of the invention the memory device 10 has an even number of blocks. In the present example thirty-two blocks $B_0, \ldots B_{31}$ are shown.

The blocks $B_0, \ldots B_{31}$ are divided into 4 quadrants $Q_0$, $Q_1$, $Q_2$, $Q_3$ of 8 blocks each. A master wordline decoder 12 runs through the center of the memory device 10. Master wordlines $MWL_0, MWL_1, MWL_2, MWL_3$ run through each quadrant. Local wordline decoders $LWD_0 \ldots LWD_{15}$ are located between each pair of blocks.

The memory cells in memory device 10 are grouped into rows and columns. In this example, as is conventional, a row refers to the array direction in which a plurality of memory cells are selected by way of a word line. A column refers to the array direction in which memory cells in the selected row are selected for reading or writing.

Figure 2:
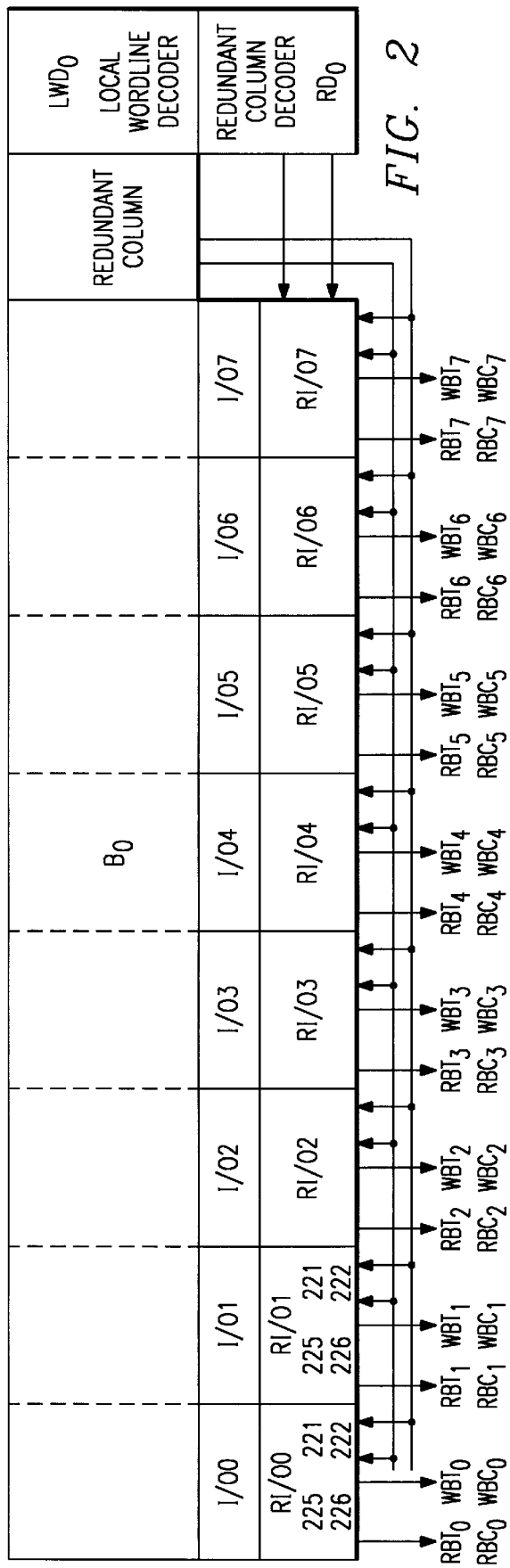
FIG. 2 is an electrical diagram, in block form, of a block in the integrated circuit memory of FIG. 1.

FIG. 2 shows a single memory block, $B_0$. Each block has eight input/output groups each having an input/output multiplexer circuit $I/0_0, \ldots I/0_7$ associated with it. In the preferred embodiment, each input/output group has sixteen adjacent primary columns of memory cells. Therefore, a memory device having thirty-two blocks, as in the present example, has 256 input/output groups, and 4096 columns.

Each input/output multiplexer circuit $I/0^0, \ldots I/0_7$ is associated with one read bus (true and complement $RBT_0$, $RBC_0, \ldots RBT_7, RBC_7$) and one write bus (true and complement $WBT_0, WBC_0, \ldots WBT_7, WBC_7$), respectively. The read busses are connected to sense amplifiers. The write busses are connected to write drivers.

In order to adequately test memory device 10, data must be written to and read from each memory cell in memory device 10. This writing and reading must be done at the maximum frequency of memory device 10. This is possible, even when using a tester with a frequency limitation lower than the maximum frequency of memory device 10, by using the circuit and testing method of the present invention.

Figure 3:
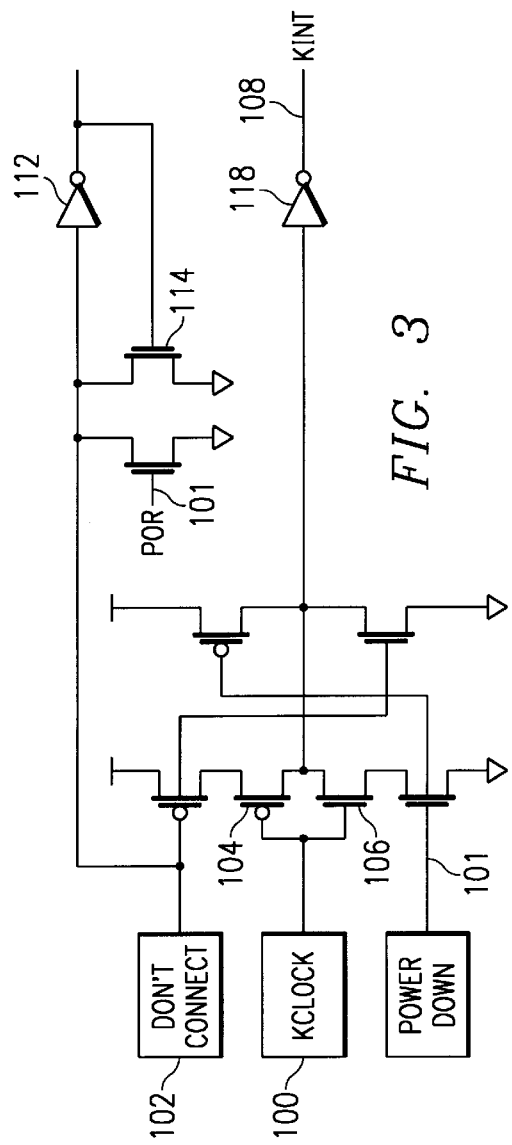
FIG. 3 is an electrical diagram, in schematic form, of the Kclock TTL input buffer of the integrated circuit memory of FIG. 1.

Referring to FIG. 3, an input buffer employing the unique circuit and testing method of the present invention will now be described. FIG. 3 is a schematic diagram of the Kclock TTL input buffer on memory device 10. Kclock 100 and PowerDown 101 are typical input pins that are present in most memory devices. Kclock 100 is a clock signal input pin. It is connected to pfet 104 and nfet 106. An internal clock signal, referred to as KINT 108, is a buffered-up form of Kclock 100. During normal operational mode, KINT 108 is cycling at the same frequency as the clock signal input to Kclock pin 100.

Don't Connect pin 102 is a pin that is guaranteed to be low during normal functional mode. At power-on-reset, POR 110 pulses high, which pulls Don't Connect 102 low. A weak half latch, consisting of inverter 112 and nfet 114 maintains the state of Don't Connect 102. Don't Connect pin 102 is defined as a pin that a user does not connect to during normal, operational mode of memory device 10. During normal operation, Power Down 101 is high. The purpose of Power Down signal 101 is to allow for powering down in sleep mode.

When memory device 10 is being tested during a test mode, Power Down 101 is still high. However, during test mode we control the state of Don't Connect pin 102. Because the half latch (inverter 112 and nfet 114) is weak, a clock signal may be connected to Don't Connect pin 102, and the clock signal will override the half latch, allowing the state of Don't Connect pin 102 to vary.

Figure 5:
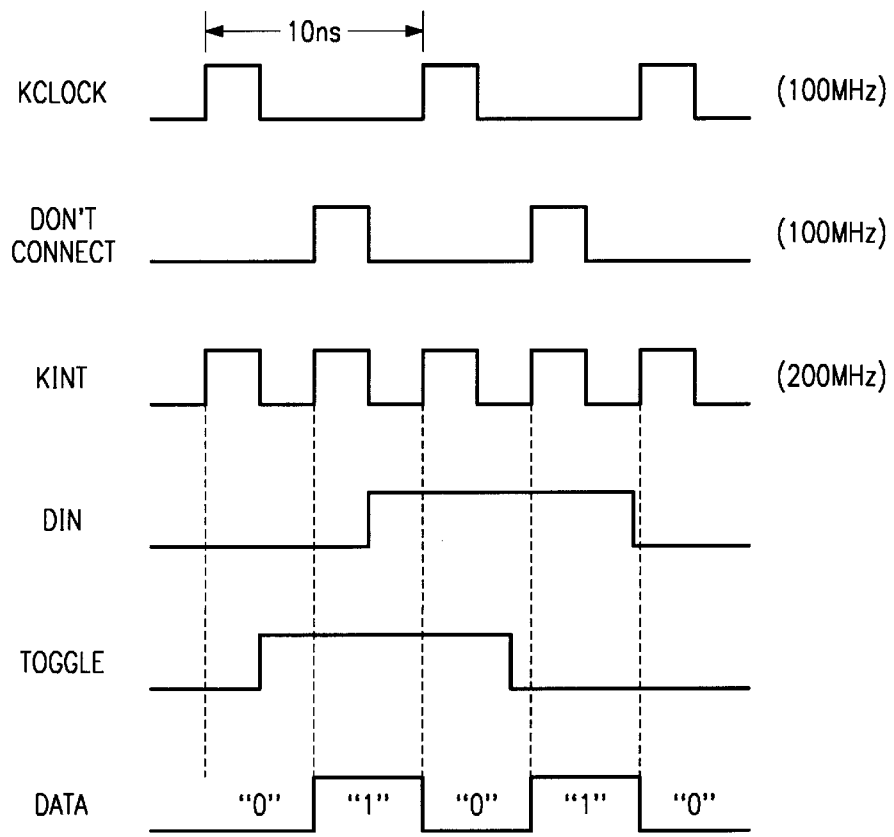
FIG. 5 is a timing diagram of an integrated circuit memory device being tested according to the present invention.

During test mode, both Kclock 100 and Don't Connect 102 are driven by separate clock signals from the tester. As shown in FIG. 5, both Kclock 100 and Don't Connect 102 are toggled once every 10 nanoseconds (ns), resulting in two 100 MHz clock signals. However, the Don't Connect pulse is shifted from the Kclock pulse. As shown in FIG. 3, every time either Kclock 100 goes high or Don't Connect 102 goes high, the input to inverter 118, which drives KINT 108, goes low, resulting in KINT 108 going high. Referring back to FIG. 5, in the described embodiment this results in KINT 108 becoming a 200 MHz clock signal. KINT 108 is the logical summation of Kclock 100 and Don't Connect 102.

Figure 4:
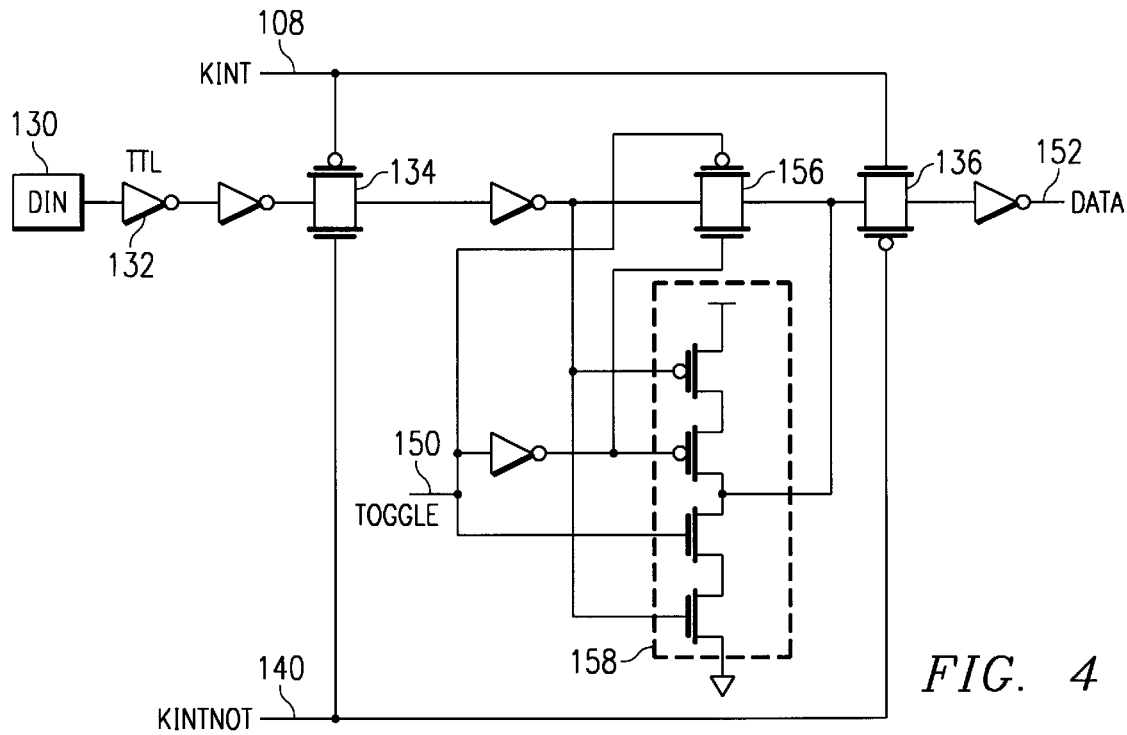
FIG. 4 is an electrical diagram, in schematic form, of the data input buffer of the integrated circuit memory of FIG. 1.

In addition to modifying the Kclock TTL input buffer, the data in buffer of memory device 10 can also be modified as shown in FIG. 4. The data in pin, DIN 130, is connected to ratioed inverter 132, and then to a master-slave flip-flop, which includes pass gates 134 and 136. KINTNOT 140 is the inverted form of KINT 108. KINT 108 and KINTNOT 140 are controlling pass gates 134 and 136. In other words, when KINT 108 goes high, the state of the data at DIN 130 is latched. Once the data is latched, pass gate 134 is turned off and pass gate 136 is turned on.

Toggle pin 150 allows data 152 to be changed and written in at higher frequencies. When toggle 150 is high, data is inverted through tri-state inverter 158 (including two pfets and two nfets). When toggle 150 is low, data instead goes through pass gate 156, rather than tri-state inverter 158. Note that toggle pin 150 may be another "don't connect" type of pin, or it may be a pin that is not required during testing, such as an output enable pin. Toggle 150 is also controlled by the tester. In the described embodiment, toggle 150 is placed after master latch 134 to avoid any data setup degradation, but it could be placed before master latch 134 if necessary.

The data 152 to be written to the memory cells may be written as all "1"s, all "0"s, or, as shown in FIG. 5, as an alternating pattern of "1"s and "0"s (i.e. 1010 or 0101), exercising data setup and hold time in the same test cycle if desired. The data is written at the increased frequency of KINT 108.

Referring now to FIG. 5, a timing diagram according to the present invention will be described. Both Kclock and Don't Connect are 100 Mhz clock signals, which are out of phase with each other. KINT is the logical combination of Kclock and Don't Connect, and has a resulting test frequency of 200 Mhz. KINT is used to test the integrated circuit at its maximum frequency. FIG. 5 also illustrates the use of Data In (DIN) and a Toggle signal. At the rising edge of KINT, the state of Toggle determines whether or not DIN is inverted. If Toggle is low, DIN is not inverted. If, however, Toggle is high, DIN is inverted. By controlling DIN and Toggle as shown in FIG. 5, an alternating pattern of "0"s and "1"s can be written at the frequency of KINT (200 Mhz in this case).

More than one additional input clock signal may be phase-shifted to have a three or four time (or more) clock multiplication for testing purposes. In the described embodiment, Don't Connect pin 102 is used. However, other pins, such as an output enable pin, may be used in conjunction with a test mode. For example, a pin could be defined to have one purpose during operational mode (i.e. output enable) and a different purpose during a test mode (i.e. toggle). One means for putting an integrated circuit into a test mode is by supplying a super-voltage to a pin. This super-voltage indicates that the integrated circuit is in test mode, and thus pins that have a different purpose during a test mode are enabled for testing, rather than operational, mode.

The method and apparatus of the present invention allow a tester with a frequency limitation lower than the maximum speed of an integrated circuit to be used to test such an integrated circuit. The present invention does not create any significant performance penalty during normal, operational mode of the integrated circuit. Furthermore, there is no significant layout area penalty associated with the present invention.

While the invention has been specifically described with reference to a preferred embodiment, it will be understood by those of ordinary skill in the art that various modifications may be made and various alternatives are possible therein without departing from the spirit and scope of the invention. The invention is limited only by the following claims and their equivalents.

What is claimed is:

1. A method of testing a logic circuit having an operational mode and a testing mode, comprising the steps of:

connecting a plurality of input clock signals having a frequency less than an operational frequency of the logic circuit to a plurality of inputs of the logic circuit, wherein each input clock signal is connected to a different one of the inputs, and wherein two or more of the input clock signals are out of phase with each other;

logically combining the input clock signals within the logic circuit to create a test clock signal, wherein the test clock signal is at a test frequency different from any of the input clock signals, the test frequency on the order of the operational frequency of the logic circuit;

connecting a data input signal to a data input of the logic circuit;

connecting a toggle signal to an input of the logic circuit; and at a state transition of the test clock signal, using the data input signal and the toggle signal to determine the state of an output signal.

2. The method of testing a logic circuit according to claim 1, further comprising the step of using the test clock signal to drive the logic circuit at the test frequency.

3. The method of testing a logic circuit according to claim 1, wherein said step of logically combining the input clock signals comprises the step of summing all input clock signals to create the test clock signal, wherein the test clock signal is at a higher frequency than any input clock signal.

4. The method of testing a logic circuit according to claim 1, wherein said step of using the data input signal and the toggle signal to determine the state of an output signal comprises the steps of:

setting the output signal to a state equal to the state of the data input signal when the toggle signal is in a first state; and setting the output signal to a state equal to an inverted data input signal when the toggle signal is in a second state.

5. The method of testing an integrated circuit having an operational mode and a testing mode, comprising the steps of:

connecting a plurality of input clock signals having a frequency less than an operational frequency of the integrated circuit to a plurality of inputs of the integrated circuit, wherein each input clock signal is connected to a different one of the inputs, and wherein two or more of the input clock signals are out of phase with each other;

logically combining the input clock signals within the integrated circuit to create a test clock signal, wherein the test clock signal is at a test frequency different from any of the input clock signals, the test frequency on the order of the operational frequency of the integrated circuit;

connecting a data input signal to a data input of the integrated circuit;

connecting a toggle signal to an input of the integrated circuit; and at a state transition of the test clock signal, using the data input signal and the toggle signal to determine the state of an output signal.

6. The method of testing an integrated circuit according to claim 5, further comprising the step of using the test clock signal to drive the integrated circuit at the test frequency.

7. The method of testing an integrated circuit according to claim 5, wherein said step of logically combining the input clock signals comprises the step of summing all input clock signals to create the test clock signal, wherein the test clock signal is at a higher frequency than any input clock signal.

8. The method of testing an integrated circuit according to claim 5, wherein said step of using the data input signal and the toggle signal to determine the state of an output signal comprises the steps of:

setting the output signal to a state equal to the state of the data input signal when the toggle signal is in a first state; and setting the output signal to a state equal to an inverted data input signal when the toggle signal is in a second state.

9. An integrated circuit having an operational mode and a testing mode comprising:

a plurality of pins, to which a plurality of input clock signals having a frequency less than an operational frequency of the integrated circuit may be connected and wherein two or more of the input clock signals are out of phase with each other;

means for logically combining the input clock signals within the integrated circuit to create a test clock signal, wherein the test clock signal is at a test frequency different from any of the input clock signals, the test frequency on the order of the operational frequency of the integrated circuit;

means for connecting a data input signal to a pin of the integrated circuit;

means for connecting a toggle signal to a pin of the integrated circuit; and at a state transition of the test clock signal, means for using the data input signal and the toggle signal to determine the state of an output signal.

10. The integrated circuit according to claim 9, further comprising means for using the test clock signal to drive the integrated circuit at the test frequency during the testing mode.

11. The integrated circuit according to claim 9, wherein said means for logically combining the input clock signals comprises means for summing all input clock signals to create the test clock signal, wherein the test clock signal is at a higher frequency than any input clock signal.

12. The integrated circuit according to claim 9, wherein said means for logically combining the input clock signals comprises a logical OR gate.

13. The integrated circuit according to claim 9, wherein said means for using the data input signal and the toggle signal to determine the state of an output signal comprises:

means for setting the output signal to a state equal to the state of the data input signal when the toggle signal is in a first state; and means for setting the output signal to a state equal to an inverted data input signal when the toggle signal is in a second state.

14. The integrated circuit according to claim 13, wherein said means for setting the output signal to a state equal to the state of the data input signal when the toggle signal is in a first state comprises a pass gate.

15. The integrated circuit according to claim 13, wherein said means for setting the output signal to a state equal to an inverted data input signal when the toggle signal is in a second state comprises a tri-state inverter.

* * * * *